US012748136B2

(12) United States Patent
Liu et al.

(10) Patent No.: US 12,748,136 B2
(45) Date of Patent: Sep. 29, 2026

(54) CURRENT SENSOR WITH HIGH AND LOW CURRENT RANGES

(71) Applicant: MultiDimension Technology Co., Ltd., Zhangjiagang (CN)

(72) Inventors: Mingfeng Liu, Zhangjiagang (CN); Ran Shi, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 161 days.

(21) Appl. No.: 18/723,367

(22) PCT Filed: Nov. 17, 2022

(86) PCT No.: PCT/CN2022/132436
§ 371 (c)(1),
(2) Date: Jun. 21, 2024

(87) PCT Pub. No.: WO2023/116279
PCT Pub. Date: Jun. 29, 2023

(65) Prior Publication Data
US 2025/0164532 A1 May 22, 2025

(30) Foreign Application Priority Data
Dec. 21, 2021 (CN) ......................... 202111569964.4

(51) Int. Cl.
*G01R 19/00* (2006.01)
*G01R 33/09* (2006.01)

(52) U.S. Cl.
CPC ....... *G01R 19/0092* (2013.01); *G01R 33/091* (2013.01)

(58) Field of Classification Search
CPC ...... G01R 15/14; G01R 15/20; G01R 15/202; G01R 15/205; G01R 15/207; G01R 19/00;
(Continued)

(56) References Cited

U.S. PATENT DOCUMENTS 8,975,889 B2 3/2015 Ausserlechner et al.
9,678,172 B2 6/2017 Ausserlechner et al.
(Continued)

FOREIGN PATENT DOCUMENTS

CN 102608384 A 7/2012
CN 103185825 A 7/2013
(Continued)

OTHER PUBLICATIONS

"Chinese Application No. 202111572274.4, First Office Action dated Mar. 6, 2023", (Mar. 6, 2023), 12 pgs.
(Continued)

*Primary Examiner* — Huy Q Phan
*Assistant Examiner* — David B Frederiksen
(74) *Attorney, Agent, or Firm* — Schwegman Lundberg & Woessner, P.A.

(57) ABSTRACT

Provided is a current sensor. An input module thereof comprises a differential copper bar and a current shunting copper bar connected in parallel. A current to be measured flows through the differential copper bar and the current shunting copper bar and generates a magnetic field at the positions of high and low current detection modules. In the high current detection module, a first magnetic induction module is secured on a circuit board and placed in an internal gap of the input module. The first magnetic induction module at least comprises a first and a second magnetic sensing units. The first and second magnetic sensing units differentially sense a magnetic field of the input module and
(Continued)

form an out signal through a first signal output module. In the low current detection module, a second magnetic induction module is secured on a circuit board and placed outside the input module. The second magnetic induction module at least comprises a third and fourth magnetic sensing units. The third and fourth magnetic sensing units differentially sense the magnetic field of input module and form an output signal through a second signal output module. The current measurement range can be increased.

19 Claims, 5 Drawing Sheets

(58) Field of Classification Search
CPC ........ G01R 19/0092; G01R 33/09–098; G01D 5/12; G01D 5/14; G01D 5/16
See application file for complete search history.

(56) References Cited

U.S. PATENT DOCUMENTS

| | | | | |
|---|---|---|---|---|
| 9,746,500 | B2 * | 8/2017 | Juds | G01R 15/207 |
| 10,281,497 | B2 | 5/2019 | Shimizu | |
| 10,488,445 | B2 | 11/2019 | Ausserlechner et al. | |
| 2006/0114098 | A1 * | 6/2006 | Shoji | G01R 15/205 338/32 R |
| 2011/0221429 | A1 * | 9/2011 | Tamura | G01R 15/207 324/244 |
| 2012/0187943 | A1 | 7/2012 | Ausserlechner et al. | |
| 2013/0057275 | A1 | 3/2013 | Tamura et al. | |
| 2015/0177339 | A1 | 6/2015 | Ausserlechner et al. | |
| 2017/0285077 | A1 | 10/2017 | Ausserlechner et al. | |
| 2018/0038898 | A1 | 2/2018 | Shimizu | |
| 2018/0059148 | A1 * | 3/2018 | Geisler | G01R 15/202 |
| 2019/0170793 | A1 * | 6/2019 | Okuyama | G01R 33/025 |
| 2019/0339307 | A1 * | 11/2019 | Hebiguchi | G01R 15/205 |
| 2019/0346489 | A1 | 11/2019 | Tamura et al. | |
| 2021/0231711 | A1 * | 7/2021 | Sugimoto | G01R 19/0038 |
| 2021/0263079 | A1 | 8/2021 | Schwarzberger et al. | |

FOREIGN PATENT DOCUMENTS

| | | | | | |
|---|---|---|---|---|---|
| CN | 107533089 | A | | 1/2018 | |
| CN | 109374941 | A | | 2/2019 | |
| CN | 112649645 | A | | 4/2021 | |
| CN | 114264859 | A | | 4/2022 | |
| JP | 2008216230 | A | * | 9/2008 | |
| WO | WO-2015133621 | A1 | * | 9/2015 | G01R 15/207 |
| WO | WO-2023116279 | A1 | | 6/2023 | |

OTHER PUBLICATIONS

"Chinese Application No. 202111572274.4, Notification to Grant Patent Right for Invention mailed Sep. 8, 2023", (Sep. 8, 2023), 3 pgs.

"International Application No. PCT/CN2022/132436, International Search Report and Written Opinion dated Jan. 20, 2023", (Jan. 20, 2023), 16 pgs.

* cited by examiner

CURRENT SENSOR WITH HIGH AND LOW CURRENT RANGES

PRIORITY CLAIM TO RELATED APPLICATIONS

This application is a U.S. national stage filing under 35 U.S.C. § 371 from International Application No. PCT/CN2022/132436, filed on 17 Nov. 2022, and published as WO2023/116279 on 29 Jun. 2023, which claims the benefit under 35 U.S.C. 119 to Chinese Application No. 202111569964.4, filed on 21 Dec. 2021, the benefit of priority of each of which is claimed herein, and which applications and publication are hereby incorporated herein by reference in their entirety.

TECHNICAL FIELD

Embodiments of the present invention relate to the technical field of current detection devices, and in particular, to a current sensor.

BACKGROUND

A current sensor can convert measured current information into electrical signals that meet certain standards according to certain rules or information in other required forms as an output. The current sensor is a detection device that can meet the requirements of information transmission, processing, storage, display, recording, and control.

At present, widely used current sensors include shunts, current transformers, Rogowski coils, optical fiber current sensors, and magnetic current sensors, which are mostly used in home appliances, smart grids, electric vehicles, wind power generation, and other fields.

The shunt is made based on the principle that a voltage is generated at both ends of a standard resistor when a direct current passes through the resistor, and is suitable for low frequency and low power. The shunt has the defects that there is no electrical isolation between a signal output end and a measured current loop, only a single type of objects can be measured, and it is difficult for the shunt to measure a high alternating current. The current transformer is made based on the principle of electromagnetic induction and can only measure an alternating current. The Rogowski coil is suitable for measuring an alternating current in a relatively wide frequency range, but cannot measure a direct current. The Rogowski coil has a relatively low sensitivity and a relatively large size. The optical fiber current sensor is made based on the Faraday effect of magneto-optical crystals. The optical fiber current sensor uses an optical fiber that is sensitive to and capable of detecting external information as a sensing component, which has relatively high measurement accuracy and is easy to miniaturize, but requires a special optical fiber with a high cost. There are many types of magnetic current sensors. For example, a Hall current sensor has the advantages of mature technology, low cost, high integration level, and small size, but has low sensitivity, poor temperature drift characteristics, and small bandwidth, and it is difficult to use it in high-accuracy current measurement occasions. Compared with the Hall current sensor, other types of magnetoresistive current sensors have relatively small saturation fields, which results in a relatively small working range, and are prone to magnetic saturation during high current measurement, which limits the current measurement range.

SUMMARY OF THE INVENTION

An embodiment of the present invention provides a current sensor to increase the current measurement range and achieve a high-accuracy detection effect when either a high current or a low current is inputted.

An embodiment of the present invention provides a current sensor, including: an input module, a high current detection module, a low current detection module, and a circuit board;

the input module comprises a differential copper bar and a current shunting copper bar connected in parallel, and a current to be measured flows perpendicularly to a cross section of the differential copper bar and the current shunting copper bar, and generates a magnetic field at the positions of the high current detection module and the low current detection module;

the high current detection module comprises a first magnetic induction module and a first signal output module, the first magnetic induction module is secured on the circuit board and placed in an internal gap of the input module, the first magnetic induction module at least comprises a first magnetic sensing unit and a second magnetic sensing unit therein, and the first magnetic sensing unit and the second magnetic sensing unit differentially sense the magnetic field of the input module, and form an output signal through the first signal output module; and the low current detection module comprises a second magnetic induction module and a second signal output module, the second magnetic induction module is secured on the circuit board and placed outside the input module, the second magnetic induction module at least comprises a third magnetic sensing unit and a fourth magnetic sensing unit therein, and the third magnetic sensing unit and the fourth magnetic sensing unit differentially sense the magnetic field of the input module, and form an output signal through the second signal output module.

An embodiment of the present invention further provides a current sensor, including: an input module, a high current detection module, a low current detection module, and a circuit board;

the input module comprises two or more current shunting copper bars connected in parallel; a current to be measured flows perpendicularly to a cross section of the current shunting copper bars, and generates a magnetic field at the positions of the high current detection module and the low current detection module;

the high current detection module is located in an internal gap of the input module; the high current detection module comprises a first magnetic induction module and a first signal output module which are secured on the circuit board, and the first magnetic induction module comprises a first magnetic sensing unit; the first magnetic sensing unit senses the magnetic field of the input module, and forms an output signal of the current sensor through the first signal output module;

the low current detection module is located outside the input module; the low current detection module comprises a second magnetic induction module and a second signal output module which are secured on the circuit board, and the second magnetic induction module comprises a second magnetic sensing unit; and the second magnetic sensing unit senses the magnetic field of the input module, and forms an output signal of the current sensor through the second signal output module.

In the embodiment of the present invention, the differential copper bar and the current shunting copper bar are connected in parallel to form the input module, and the current to be measured is shunted. The high current detection module is located in the internal gap of the input module, the low current detection module is located outside the input module, and the first magnetic induction module and the second magnetic induction module differentially sense the magnetic field of the input module respectively, and then form an output signal through the first signal output module and the second signal output module, thereby realizing that the current sensor differentially senses, through the magnetic induction module, a differential mode magnetic field generated by the current to be measured flowing through the input module. The current sensor provided in the embodiment of the present invention can regulate the current input range and sensitivity by adjusting the shape and distribution of each copper bar, so that the current measurement range is large, and the current sensor is suitable for magnetic sensing units in various working ranges. The current sensor can achieve high-accuracy detection when either a high current or a low current is inputted, and can also measure a direct current and/or an alternating current. Moreover, the input module and the signal output module are electrically isolated, which can improve the ability to resist external magnetic field interference.

BRIEF DESCRIPTION OF THE DRAWINGS

In order to more clearly illustrate the technical solutions in the embodiments of the present invention or the prior art, the drawings required for use in the embodiments or the prior art are briefly introduced below. Obviously, although the drawings described below are some specific embodiments of the present invention, for those skilled in the art, the basic concepts of the device structure, driving method, and manufacturing method disclosed and prompted by various embodiments of the present invention can be expanded and extended to other structures and drawings, and there is no doubt that these should fall within the scope of the claims of the present invention.

DETAILED DESCRIPTION

In order to make the purposes, technical solutions, and advantages of the present invention clearer, the technical solutions of the present invention will be clearly and completely described below through implementations with reference to the drawings in the embodiments of the present invention. Obviously, the described embodiments are some embodiments, rather than all the embodiments of the present invention. Based on the basic concepts disclosed and prompted by the embodiments of the present invention, all other embodiments obtained by those skilled in the art fall within the protection scope of the present invention.

Figure 1:
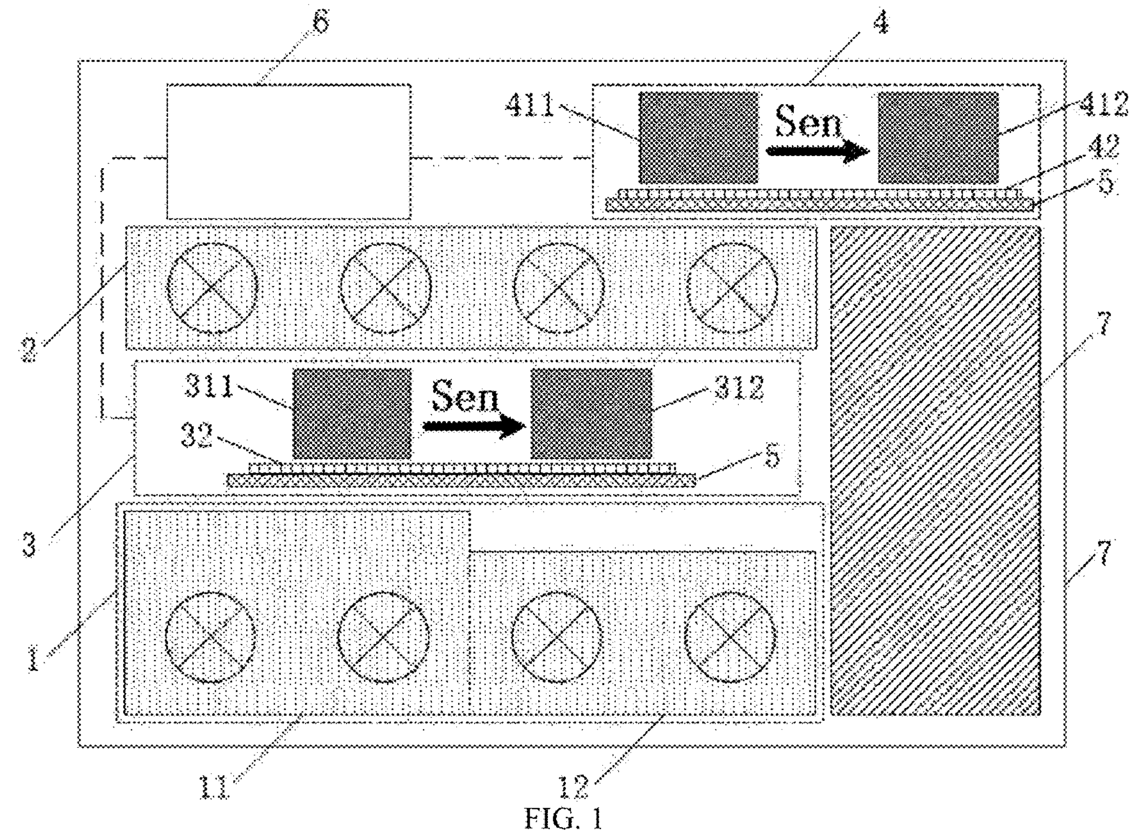
FIG. 1 is a schematic diagram of a current sensor provided in an embodiment of the present invention.

FIG. 1 shows a schematic diagram of a current sensor provided in an embodiment of the present invention. The current sensor in this embodiment includes: an input module, a high current detection module 3, a low current detection module 4, and a circuit board 5. The input module includes a differential copper bar 1 and a current shunting copper bar 2 connected in parallel, and a current to be measured flows perpendicularly to a cross section of the differential copper bar 1 and the current shunting copper bar 2, and generates a magnetic field at the positions of the high current detection module 3 and the low current detection module 4. The high current detection module 3 includes a first magnetic induction module and a first signal output module 32, the first magnetic induction module is secured on the circuit board 5 and placed in an internal gap of the input module, the first magnetic induction module at least includes a first magnetic sensing unit 311 and a second magnetic sensing unit 312 therein, and the first magnetic sensing unit 311 and the second magnetic sensing unit 312 differentially sense the magnetic field of the input module, and form an output signal through the first signal output module 32. The low current detection module 4 includes a second magnetic induction module and a second signal output module 42, the second magnetic induction module is secured on the circuit board 5 and placed outside the input module, the second magnetic induction module at least includes a third magnetic sensing unit 411 and a fourth magnetic sensing unit 412 therein, and the third magnetic sensing unit 411 and the fourth magnetic sensing unit 412 differentially sense the magnetic field of the input module, and form an output signal through the second signal output module 42.

In this embodiment, the input module includes the differential copper bar 1 and the current shunting copper bar 2 connected in parallel. In the cross-sectional view of the current sensor as shown in FIG. 1, there is a gap between the differential copper bar 1 and the current shunting copper bar 2. The differential copper bar 1, the current shunting copper bar 2, and the gap therebetween can be defined as the area of the input module, and then, the gap is an internal gap of the input module. Correspondingly, the periphery of the area of the input module can be defined as the outside of the input module. It can be seen from this that the high current detection module 3 secured on the circuit board 5 is placed in the internal gap of the input module, that is, the high current detection module 3 is located between the differential copper bar 1 and the current shunting copper bar 2; and the low current detection module 4 secured on the circuit board 5 is placed outside the input module, and optionally, the low current detection module 4 is located outside the side of the current shunting copper bar 2 away from the differential copper bar 1. It can be understood that the cross-sectional view of the current sensor is a cross-sectional view obtained by taking a plane perpendicular to the differential copper bar 1 and the current shunting copper bar 2 to cut the current sensor.

The current sensor is used to detect a current, and the current to be measured flows into the current sensor. Specifically, the current to be measured flows through the cross section perpendicular to the differential copper bar 1 and the current shunting copper bar 2, generates a magnetic field at the position of the high current detection module 3, and also generates a magnetic field at the position of the low current detection module 4.

The high current detection module 3 includes a first magnetic induction module (not numbered) and a first signal output module 32, where the first magnetic induction module is secured on the circuit board 5 and placed in the internal gap of the input module, that is, the high current detection module 3 is located between the differential copper bar 1 and the current shunting copper bar 2. As shown in FIG. 1, the first magnetic induction module at least includes a first magnetic sensing unit 311 and a second magnetic sensing unit 312 therein. After the current to be measured flows into the input module, the first magnetic sensing unit 311 and the second magnetic sensing unit 312 differentially sense the magnetic field of the input module, and the magnetic field signal is processed by the first signal output module 32 to form an output signal of the current sensor.

The low current detection module 4 includes a second magnetic induction module (not numbered) and a second signal output module 42, where the second magnetic induction module is secured on the circuit board 5 and placed outside the input module, and optionally, the low current detection module 4 is located on the side of the current shunting copper bar 2 away from the differential copper bar 1. As shown in FIG. 1, the second magnetic induction module at least includes a third magnetic sensing unit 411 and a fourth magnetic sensing unit 412 therein, where the third magnetic sensing unit 411 and the fourth magnetic sensing unit 412 are located on the same side of the outside of the input module, and optionally are located above the input module and near the current shunting copper bar 2. The third magnetic sensing unit 411 is located within the vertical projection coverage of the current shunting copper bar 2, and the fourth magnetic sensing unit 412 is located outside the vertical projection coverage. The sensitivity directions of the third magnetic sensing unit 411 and the fourth magnetic sensing unit 412 are both rightward. After the current to be measured flows into the input module, the third magnetic sensing unit 411 and the fourth magnetic sensing unit 412 differentially sense the magnetic field of the input module, and the magnetic field signal is processed by the second signal output module 42 to form an output signal of the current sensor.

As shown in FIG. 1, optionally, the first magnetic sensing unit 311 is located above the differential copper bar 1, and the sensitivity direction of the first magnetic sensing unit 311 is the same as or opposite to the direction of the magnetic field generated by the differential copper bar 1 at the first magnetic sensing unit 311, and is along the direction in the plane of the first magnetic induction module and perpendicular to the direction of the current to be measured. The sensitivity direction of the second magnetic sensing unit 312 is the same as that of the first magnetic sensing unit 311, and the distance between the second magnetic sensing unit 312 and the differential copper bar 1 is greater than the distance between the first magnetic sensing unit 311 and the differential copper bar 1.

Optionally, the differential copper bar 1 is in a step shape near the first magnetic induction module, and at least includes a first step 11 and a second step 12. The first magnetic sensing unit 311 is located above the first step 11, and the second magnetic sensing unit 312 is located above the second step 12. The sensitivity direction of the first magnetic sensing unit 311 is the same as or opposite to the direction of the magnetic field generated by the differential copper bar 1 at the first magnetic sensing unit 311, and is along the direction in the plane of the first magnetic induction module and perpendicular to the direction of the current to be measured. The sensitivity direction of the second magnetic sensing unit 312 is the same as or opposite to the direction of the magnetic field generated by the differential copper bar 1 at the second magnetic sensing unit 312, and is along the direction in the plane of the second magnetic induction module and perpendicular to the direction of the current to be measured.

Specifically, as shown in FIG. 1, a differential copper bar 1 with a stepped cross section and a current shunting copper bar 2 with a rectangular cross section are used, the two are connected in parallel and shunted to form an input module, and there is a gap between the differential copper bar 1 and the current shunting copper bar 2. The side of the stepped differential copper bar 1 facing the current shunting copper bar 2 is stepped, and the cross-sectional view thereof includes a first step 11 and a second step 12 as shown in FIG. 1. The first magnetic sensing unit 311 is located in a magnetic field uniform area above the first step 11, and the second magnetic sensing unit 312 is located in a magnetic field uniform area above the second step 12. The first magnetic sensing unit 311 and the second magnetic sensing unit 312 are both located in a magnetic field uniform area of the current shunting copper bar 2, and the sensitivity directions are both rightward.

Figure 2:
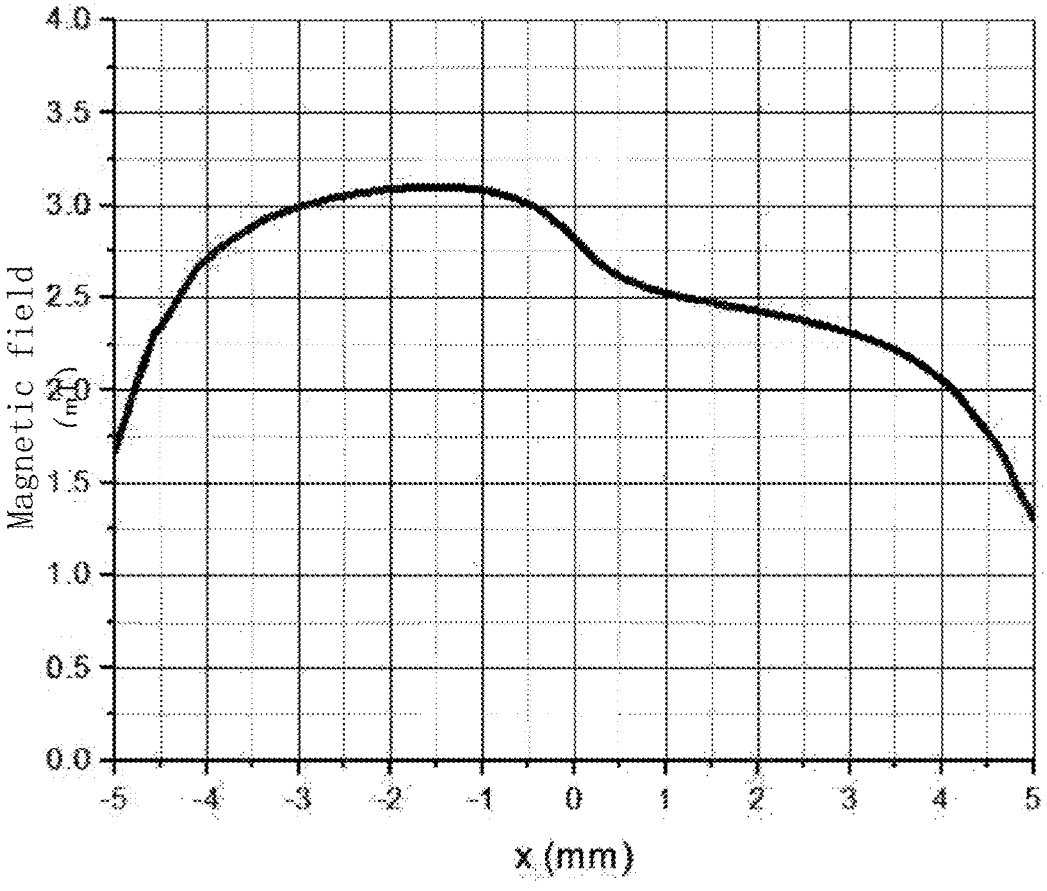
FIG. 2 is a magnetic field simulation diagram of a stepped differential copper bar in FIG. 1.

FIG. 2 shows a magnetic field simulation diagram of a stepped differential copper bar. It is assumed that the current $I_{in}$ to be measured is 50 A, and the cross-sectional width of the stepped differential copper bar 1 is 10 mm. When the current to be measured flows into the input module, a magnetic field is generated at a horizontal plane 0.6 mm above the differential copper bar 1. As shown in FIG. 2, it can be seen that near the step rising section of the differential copper bar 1, the magnetic fields in the same plane above the first step 11 and the second step 12 have an obvious difference, and the magnetic field distribution is relatively uniform.

Figure 3:
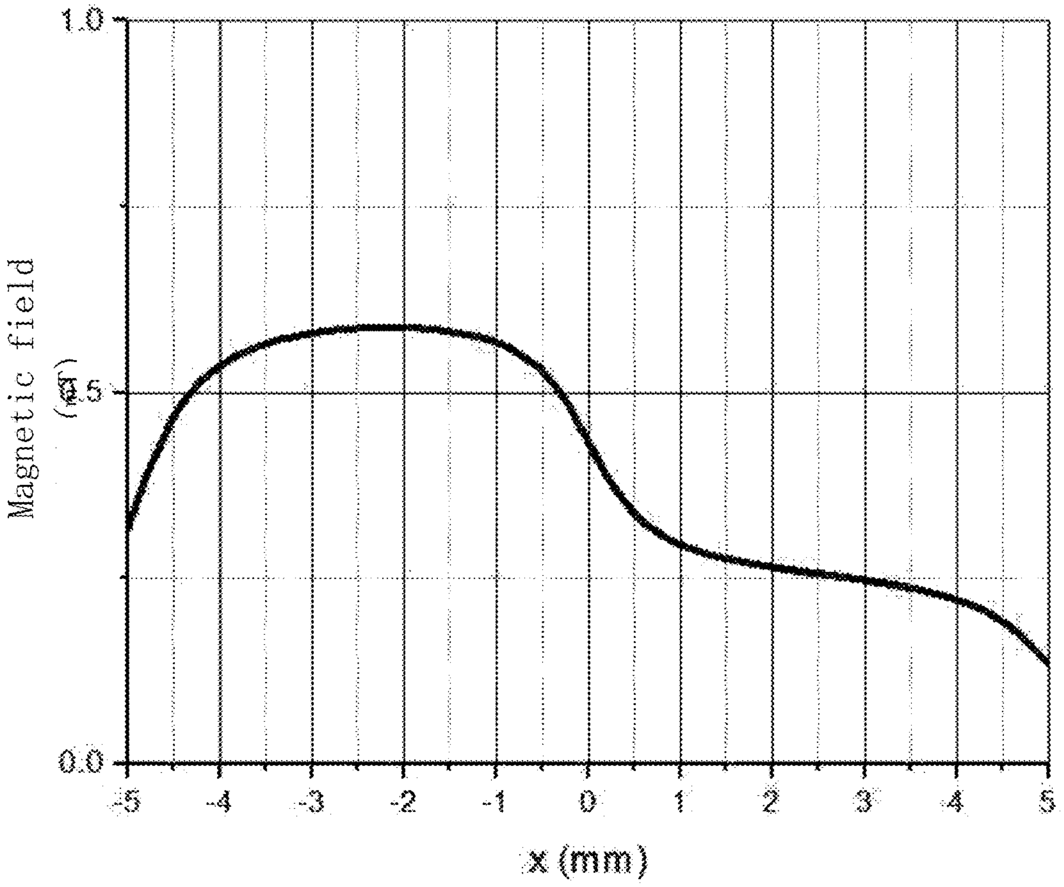
FIG. 3 is a magnetic field simulation diagram of an input module in FIG. 1.

FIG. 3 shows a magnetic field simulation diagram of an input module. On the basis of the differential copper bar 1, a current shunting copper bar 2 with a cross-sectional width of 10 mm is introduced, and the current shunting copper bar 2 is connected in parallel with the differential copper bar 1. Magnetic field simulation calculation results thereof are shown in FIG. 3. It can be seen that compared with FIG. 2, the shape of the magnetic field distribution of the input module remains roughly the same, but the overall curve shows an obvious downward shift, that is, the magnetic field decreases.

The current $I_{in}$ to be measured is allowed to flow perpendicularly to the cross section of the input module, and the current direction in FIG. 1 is perpendicular to the paper and inward. Assuming that the current passing through the first step 11 is $I_{11}$, the current passing through the second step 12 is $I_{12}$, and the current passing through the current shunting copper bar 2 is $I_2$, then the current $I^1$ flowing through the differential copper bar 1 is $I_1=I_{11}+I_{12}$. The first magnetic sensing unit 311 and the second magnetic sensing unit 312 are located in the magnetic field uniform area of the current shunting copper bar 2, the copper bars are made of the same material, and then Formula (1) is obtained:

$$I_{in} = I_{11} + I_{12} + I_2 \tag{1}$$

In order to facilitate analysis and calculation, the entirety of the first step 11 and the second step 12 may be re-divided into upper and lower rectangular cross-sectional parts according to the height of the second step 12. The height of the lower rectangle divided by the differential copper bar 1 is consistent with the height of the second step 12, and the width of the lower rectangle is the sum of the first step 11 and the second step 12. The height of the upper rectangle divided by the differential copper bar 1 is the height difference between the first step 11 and the second step 12, and the width of the upper rectangle is consistent with the first step 11. Then, the first magnetic sensing unit 311 and the second magnetic sensing unit 312 are located above the lower rectangle, and the first magnetic sensing unit 311 is located above the upper rectangle. It can be concluded that the first magnetic sensing unit 311 and the second magnetic sensing unit 312 are located in the magnetic field uniform area of the lower rectangle, and the first magnetic sensing unit 311 is located in the magnetic field uniform area of the upper rectangle.

Based on this, the current $I_1$ flowing through the stepped differential copper bar 1 can be divided into a current $I'_1$ of the lower rectangle and a current $\Delta I_1$ of the upper rectangle, and then, Formula (2) and Formula (3) are obtained:

$$I = I_1' + \Delta I_1 \quad (2)$$

$$I_{in} = I_1' + \Delta I_1 + I_2 \quad (3)$$

Taking the horizontally rightward direction shown in FIG. 1 as a forward direction of a magnetic field, according to the Biot-Savart law of the magnetic field generated by a current carrying conductor, the magnetic field $H_{211}$ generated by the current $I_1$ of the stepped differential copper bar 1 at the position of the first magnetic sensing unit 311 and the magnetic field $H_{212}$ generated at the position of the second magnetic sensing unit 312 respectively change linearly with the current, and then, Formula (4) is obtained:

$$H_{211} = k_1 I_1' + k_{21}\Delta I_1 - k_3 I_2; \quad (4)$$
$$H_{212} = k_1 I_1' + k_{22}\Delta I_1 - k_3 I_2$$

where $k_1$ is a linear constant of the uniform magnetic field generated by the current $I'_1$ of the lower rectangle at the positions of the first magnetic sensing unit 311 and the second magnetic sensing unit 312, $k_3$ is a linear constant of the uniform magnetic field generated by the current $I_2$ of the current shunting copper bar at the positions of the first magnetic sensing unit 311 and the second magnetic sensing unit 312, $k_{21}$ is a linear constant of the magnetic field generated by the current $\Delta I_1$ of the upper rectangle at the position of the first magnetic sensing unit 311, and $k_{22}$ is a linear constant of the magnetic field generated by the current $\Delta I_1$ of the upper rectangle at the position of the second magnetic sensing unit 312.

By performing an equivalent transformation on Formula (4), the magnetic field at the positions of the first magnetic sensing unit 311 and the second magnetic sensing unit 312 is decomposed into a common mode magnetic field $H_{CM}$ and a differential mode magnetic field $H_{DM}$, and then, Formula (5) is obtained:

$$H_{CM} = \frac{1}{2}(H_{211} + H_{212}) = -k_3 I_2 + k_1 I_1' + \frac{1}{2}(k_{21} + k_{22}) \times \Delta I_1 \quad (5)$$
$$H_{DM} = \frac{1}{2}(H_{211} - H_{212}) = \frac{1}{2}(k_{21} - k_{22}) \times \Delta I_1$$

Correspondingly, the magnetic field at the positions of the first magnetic sensing unit 311 and the second magnetic sensing unit 312 can be converted into a superposition representation of the common mode magnetic field $H_{CM}$ and the differential mode magnetic field $H_{DM}$, as expressed in Formula (6):

$$H_{211} = H_{CM} + H_{DM} \quad (6)$$
$$H_{212} = H_{CM} - H_{DM}$$

It can be seen from Formula (5) and FIG. 1 that the direction of the magnetic field generated by the current $I'_1$ of the lower rectangle at the positions of the first magnetic sensing unit 311 and the second magnetic sensing unit 312 is opposite to the direction of the magnetic field generated by the current $I_2$ of the current shunting copper bar at the positions of the first magnetic sensing unit 311 and the second magnetic sensing unit 312, and the two can be offset. Specifically, the magnetic field generated by the current $I'_1$ of the lower rectangle at the positions of the first magnetic sensing unit 311 and the second magnetic sensing unit 312 is $k_1I'_1$, the magnetic field generated by the current $I_2$ of the current shunting copper bar at the positions of the first magnetic sensing unit 311 and the second magnetic sensing unit 312 is $K_3I_2$, and the two can offset and reduce, that is, $k_1I'_1-k_3I_2$, and may even return to zero after offset, such as $k_1I'_1-k_3I_2=0$.

Then, after offset, the common mode magnetic field $H_{CM}$ and the magnetic field generated by the differential copper bar 1 alone may be in the same direction, zeroed, or in opposite directions. It can be understood that the magnetic field generated by the differential copper bar 1 alone can be understood as the magnetic field generated by the current $\Delta I_1$ of the upper rectangle in the differential copper bar 1 at the positions of the first magnetic sensing unit 311 and the second magnetic sensing unit 312. Moreover, the current $I'_1$ of the lower rectangle and the current $I_2$ of the current shunting copper bar only generate the common mode magnetic field $H_{CM}$ at the positions of first magnetic sensing unit 311 and the second magnetic sensing unit, but do not generate the differential mode magnetic field $H_{DM}$, thereby achieving the effects of adjusting and increasing the input range of the current that can be measured by the current sensor.

Furthermore, for the low current detection module 4, according to the Biot-Savart law of the magnetic field generated by the current carrying conductor, it can be known that different from the situation in the previous analysis that the magnetic fields generated by the differential copper bar 1 and the current shunting copper bar 2 at the position of the high current detection module 3 are in opposite directions and thus mutually offset or reduced, the low current detection module 4 is located outside the input module composed of the differential copper bar 1 and the current shunting copper bar 2. Optionally, the low current detection module 4 is located on the side of the current shunting copper bar 2 away from the differential copper bar 1, that is, at the upper position of the outside of the input module. In other embodiments, optionally, the low current detection module may also be located on the side of the differential copper bar away from the current shunting copper bar, that is, at the lower position of the outside of the input module. Therefore, the magnetic fields generated by the differential copper bar 1 and the current shunting copper bar 2 at the low current detection module 4 have the same direction.

In FIG. 1, the magnetic fields generated by the differential copper bar 1 and the current shunting copper bar 2 at the position of the third magnetic sensing unit 411 in the low current detection module 4 have the same direction, and then, the two can be superimposed to increase, thereby generating a larger magnetic field in the case of a low current to ensure more accurate detection of a low current to be measured. The input range of the current that can be measured by the current sensor is expanded.

Optionally, the number of current shunting copper bars is one or more, wherein any current shunting copper bar is located above the first magnetic induction module or below the differential copper bar, and the vertical projection range of any current shunting copper bar covers the first magnetic sensing unit and the second magnetic sensing unit in the first magnetic induction module. As shown in FIG. 1, optionally, the number of current shunting copper bar 2 is one, which is located above the first magnetic induction module, and the vertical projection range of the current shunting copper bar 2 covers the first magnetic sensing unit 311 and the second magnetic sensing unit 312 in the first magnetic induction module.

Figure 4:
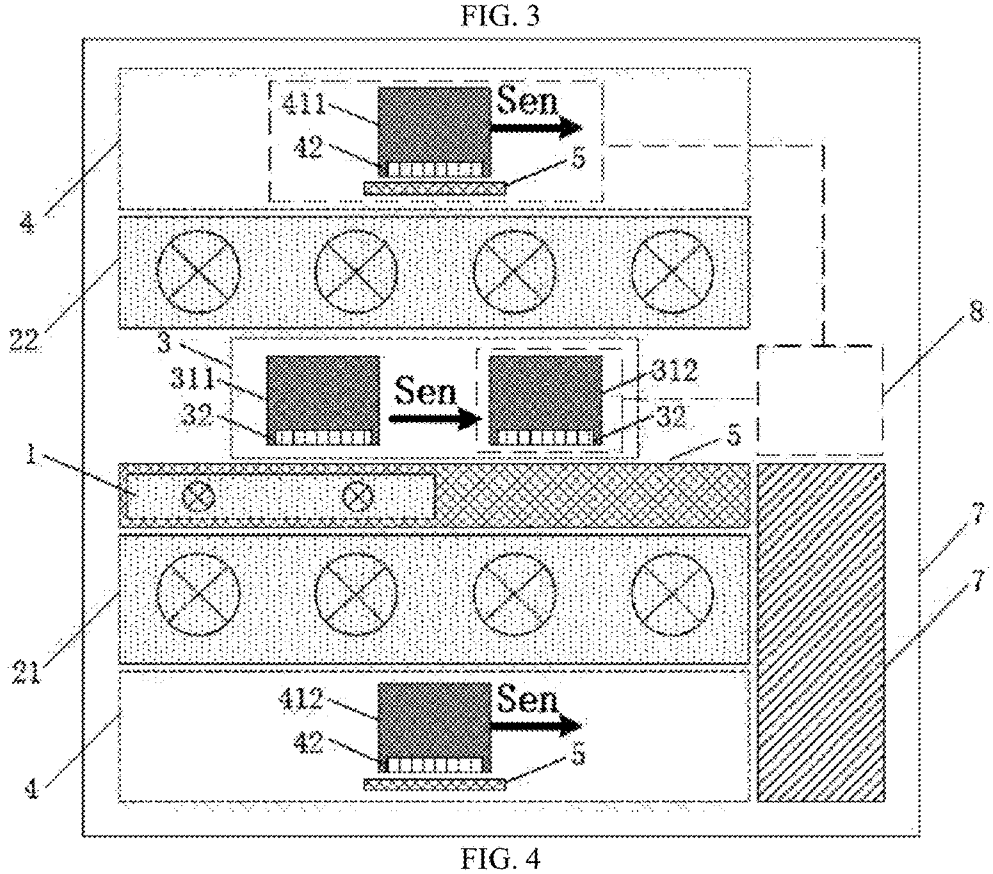
FIG. 4 is a schematic diagram of another current sensor provided in an embodiment of the present invention.

FIG. 4 shows a schematic diagram of another current sensor provided in an embodiment of the present invention. As shown in FIG. 4, optionally, the differential copper bar 1 is located inside the circuit board 5. Optionally, the number of current shunting copper bars is two, where the current shunting copper bar 21 is located below the differential copper bar 1, the current shunting copper bar 22 is located above the first magnetic induction module, and the vertical projection range of the current shunting copper bars 21 and 22 covers the first magnetic sensing unit 311 and the second magnetic sensing unit 312 in the first magnetic induction module. The input module is composed of a differential copper bar 1 with a rectangular cross section and two current shunting copper bars 21 and 22 with rectangular cross sections, which are connected in parallel and shunted. The two rectangular current shunting copper bars 21 and 22 are arranged opposite to each other, and the rectangular differential copper bar 1 is located in the gap between the two rectangular current shunting copper bars 21 and 22. The high current detection module 3 is placed in the gap between the rectangular differential copper bar 1 and the rectangular current shunting copper bar 22. The rectangular differential copper bar 1 is close to one side of the first magnetic sensing unit 311 and is located above the current shunting copper bar 21.

Based on this, the first magnetic sensing unit 311 and the second magnetic sensing unit 312 are located in the magnetic field uniform area of the current shunting copper bar 21 and also located in the magnetic field uniform area of the current shunting copper bar 22, and the sensitivity directions are both rightward. The first magnetic sensing unit 311 is located in the magnetic field uniform area of the differential copper bar 1. Then, the analysis and calculation processes of this input module are similar to those of the input module composed of the stepped differential copper bar 1 and the rectangular current shunting copper bar 2 shown in FIG. 1. Therefore, the current of the rectangular differential copper bar 1 in FIG. 4 can be analogized as the current $\Delta I_1$ of the upper rectangle in FIG. 1, and the current of the current shunting copper bar 21 in FIG. 4 can be analogized as the current $I'_1$ of the lower rectangle in FIG. 1.

Since it is assumed that the first magnetic sensing unit 311 and the second magnetic sensing unit 312 are both located in the magnetic field uniform area of the current shunting copper bar 21 and the current shunting copper bar 22, when there is a gap between the differential copper bar 1 and the current shunting copper bar 21, Formula (1) to Formula (6) are still valid.

As described above, it can be seen from Formula (5) and Formula (6) that the magnetic field at the positions of the first magnetic sensing unit 311 and the second magnetic sensing unit 312 is directly proportional to the current $I_{in}$ to be measured, and the current to be measured can be measured by measuring the differential mode magnetic field $H_{DM}$. The analysis and calculation of multiple current shunting copper bars are roughly the same as the above analysis process, except for the adjustment of the $k_3I_2$ term and the common mode magnetic field $H_{CM}$.

Furthermore, under ideal conditions, the common mode magnetic field $H_{CM}$ is completely offset, and then, Formula (7) and Formula (8) are obtained:

$$H_{CM} = \frac{1}{2}(H_{211} + H_{212}) = 0 \tag{7}$$

$$H_{DM} = \frac{1}{2}(H_{211} - H_{212}) = \frac{1}{2}(k_{21} - k_{22})\Delta I_1$$

$$H_{211} = H_{CM} + H_{DM} = H_{DM} = \frac{1}{2}(k_{21} - k_{22})\Delta I_1 \tag{8}$$

$$H_{212} = H_{CM} - H_{DM} = -H_{DM} = -\frac{1}{2}(k_{21} - k_{22})\Delta I_1$$

Furthermore, under ideal conditions, the magnetic field generated by $\Delta I_1$ at the position of the second magnetic sensing unit 312 is very small, and it can be approximately assumed that $k_{22}=0$, so Formulae (7-8) can be simplified to Formulae (9-10):

$$H_{CM} = 0 \tag{9}$$

$$H_{DM} = \frac{1}{2}k_{21}\Delta I_1$$

$$H_{211} = H_{DM} = \frac{1}{2}k_{21}\Delta I_1 \tag{10}$$

$$H_{212} = -H_{DM} = -\frac{1}{2}k_{21}\Delta I_1$$

That is, the magnetic field at the positions of the first magnetic sensing unit 311 and the second magnetic sensing unit 312 is directly proportional to the current $I_{in}$ to be measured, and the current to be measured can be measured by measuring the differential mode magnetic field $H_{DM}$.

Combining Formula (9) and Formula (10), it can be seen that under ideal conditions, the common mode magnetic field $H_{CM}$ is completely offset, that is, the current to be measured only generates a differential mode magnetic field $H_{DM}$ at the positions of the first magnetic sensing unit 311 and the second magnetic sensing unit 312, and the size of the differential mode magnetic field $H_{DM}$ can be adjusted by the shape of the copper bar in the input module, so that the size of the differential mode magnetic field $H_{DM}$ completely matches the linear working range of the magnetoresistive sensitive component. Thus, the current measurement range of the current sensor can reach the maximum.

As described above, the high current detection module 3 uses differential measurement for the differential mode magnetic field generated by the input module, and can partially or completely offset the common mode magnetic field, thereby effectively solving the problem of easy saturation of magnetoresistive sensitive components, then adjusting and expanding the current measurement range, and providing a good ability to resist external magnetic field interference. As a result, the current sensor is suitable for current detection in various working ranges.

Optionally, the current sensor further includes: a switching module 6. The switching module 6 selects to switch to the high current detection module 3 or the low current detection module 4 according to the range of the current to be measured. The input module, the high current detection module 3, the low current detection module 4, and the switching module 6 are electrically isolated from each other. Optionally, a dielectric isolation layer is used to electrically isolate the modules from each other. When the switching module 6 switches to the high current detection module 3, the high current detection module 3 works, and then, the current sensor can be used to measure a high current. When the switching module 6 switches to the low current detection module 4, the low current detection module 4 works, and then, the current sensor can be used to measure a low current.

Optionally, the current sensor further includes a mechanical support housing 7. The mechanical support housing 7 plays roles in wrapping, fixing, and supporting each part inside the current sensor and providing an external interface.

In the embodiment of the present invention, the differential copper bar and the current shunting copper bar are connected in parallel to form the input module, and the current to be measured is shunted. The high current detection module is located in the internal gap of the input module, the low current detection module is located outside the input module, and the first magnetic induction module and the second magnetic induction module differentially sense the magnetic field of the input module respectively, and then form an output signal through the first signal output module and the second signal output module, thereby realizing that the current sensor differentially senses, through the magnetic induction modules, a differential mode magnetic field generated by the current to be measured flowing through the input module. The current sensor provided in the embodiment of the present invention can regulate the current input range and sensitivity by adjusting the shape and distribution of each copper bar, so that the current measurement range is large, and the current sensor is suitable for magnetic sensing units in various working ranges. The current sensor can achieve high-accuracy detection when either a high current or a low current is inputted, and can also measure a direct current and/or an alternating current. Moreover, the input module and the signal output module are electrically isolated, which can improve the ability to resist external magnetic field interference.

Optionally, the first magnetic sensing unit and the second magnetic sensing unit in the first magnetic induction module are connected to form any one of a differential half-bridge structure, a differential full-bridge structure, a double push-pull half-bridge differential structure, and a double push-pull full-bridge differential structure. The third magnetic sensing unit and the fourth magnetic sensing unit in the second magnetic induction module are connected to form any one of a differential half-bridge structure, a differential full-bridge structure, a double push-pull half-bridge differential structure, and a double push-pull full-bridge differential structure.

For the differential half-bridge structure, each magnetic sensing unit includes a magnetoresistive bridge arm, and two magnetoresistive bridge arms in the same magnetic induction module are electrically differentiated together to form the differential half-bridge structure.

For the differential full-bridge structure, each magnetic sensing unit includes two magnetoresistive bridge arms, two magnetoresistive bridge arms in the same magnetic sensing unit are located on two opposite bridge arms, two magnetoresistive bridge arms of different magnetic sensing units are located on two adjacent bridge arms to form the differential full-bridge structure, and the output signal of the magnetic induction module is a differential signal of the differential full-bridge structure.

For the double push-pull half-bridge differential structure, two magnetic sensing units in the same magnetic induction module both include two magnetoresistive bridge arms, two magnetoresistive bridge arms in each magnetic sensing unit have opposite sensitivity directions, two magnetoresistive bridge arms in the magnetic sensing unit are upper and lower bridge arms and form a push-pull half-bridge structure, the sensitivity directions of the upper bridge arms in the two magnetic sensing units are the same and the sensitivity directions of the lower bridge arms in the two magnetic sensing units are the same, two magnetic sensing units in the same magnetic induction module form the double push-pull half-bridge differential structure as a whole, and the output signal of the magnetic induction module is a differential signal of the double push-pull half-bridge differential structure.

For the double push-pull full-bridge differential structure, two magnetic sensing units in the same magnetic induction module both include four magnetoresistive bridge arms, four magnetoresistive bridge arms of the magnetic sensing unit form a push-pull full-bridge structure, the sensitivity directions of two magnetic sensing units in the same magnetic induction module are the same, two magnetic sensing units in the same magnetic induction module form the double push-pull full-bridge differential structure as a whole, and the output signal of the magnetic induction module is a differential signal of the double push-pull full-bridge differential structure. The magnetoresistive bridge arm is formed by connecting one or more magnetoresistive sensitive components in series and parallel.

Optionally, there are two device options for two magnetic sensing units in the same magnetic induction module: (1) two magnetic sensing units are composed of one of the magnetic sensing components including a fluxgate, a giant magneto-impedance (GMI) device, and a magnetoelectric coupling device (ME); and (2) magnetoresistive sensitive components that form the differential structure in two magnetic sensing units are composed of one of an anisotropic magnetoresistance (AMR) device, a giant magnetoresistance (GMR) device, a tunnel magnetoresistance (TMR) device, and a colossal magnetoresistance (CMR) device.

Figure 5:
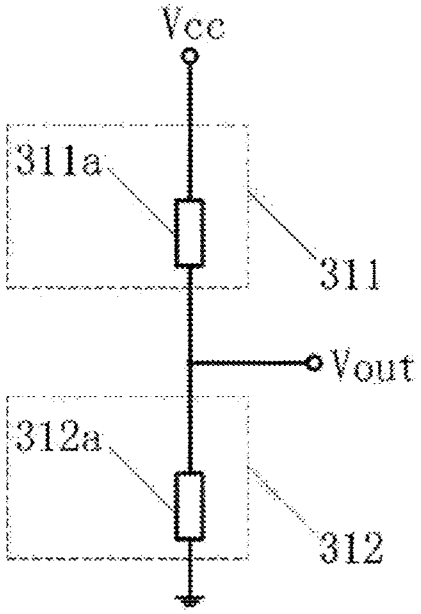
FIG. 5 is a schematic diagram of a differential half-bridge structure.

FIG. 5 shows a schematic diagram of a differential half-bridge structure. As shown in FIG. 5, the high current detection module 3 uses a single bridge with a differential half-bridge structure. Specifically, the first magnetic sensing unit 311 and the second magnetic sensing unit 312 in the first magnetic induction module are connected to form a differential half-bridge structure. For the differential half-bridge structure, the first magnetic sensing unit 311 includes a magnetoresistive bridge arm 311*a*, and the second magnetic sensing unit 312 includes a magnetoresistive bridge arm 312*a*. The two magnetoresistive bridge arms 311*a* and 312*a* in the first magnetic induction module are connected together and electrically differentiated to form a differential half-bridge structure, where the sensitivity directions of the two magnetoresistive bridge arms 311*a* and 312*a* are the same and are horizontally rightward. Optionally, the magnetoresistive bridge arm is composed of one or more magnetoresistive sensitive components, and magnetoresistive sensitive components in the magnetoresistive bridge arms 311*a* and 312*a* are TMR devices.

According to the above analysis and calculation and the schematic diagram of the differential half-bridge structure shown in FIG. 5, it can be known that in the case shown in FIG. 1, the common mode magnetic field generated after the differential copper bar 1 and the current shunting copper bar 2 are offset and the horizontally rightward magnetic field generated by the differential copper bar 1 at the position of the first magnetic induction module may be in the same direction, zeroed, or in opposite directions.

Taking an example that after offset, the direction of the common mode magnetic field generated after the differential copper bar 1 and the current shunting copper bar 2 are offset is horizontally rightward, that is, they are in the same direction after offset, then the differential mode magnetic field $H_{DM}$ causes the rightward magnetic field at the position of the first magnetic sensing unit 311 to be greater than the rightward magnetic field at the position of the second magnetic sensing unit 312. Since the sensitivity directions of two magnetoresistive bridge arms 311*a* and 312*a* are both rightward, the rightward magnetic field at the position of the magnetoresistive bridge arm 311*a* is greater than the magnetic field at the position of the magnetoresistive bridge arm 312*a* in FIG. 5. As a result, the resistance of the magnetoresistive bridge arm 311*a* is less than the resistance of the magnetoresistive bridge arm 312*a*, thereby realizing the change from a magnetic field to a voltage. Therefore, Vout in FIG. 5 will change correspondingly according to the situation of the current to be measured to form a differential voltage signal.

Figure 6:
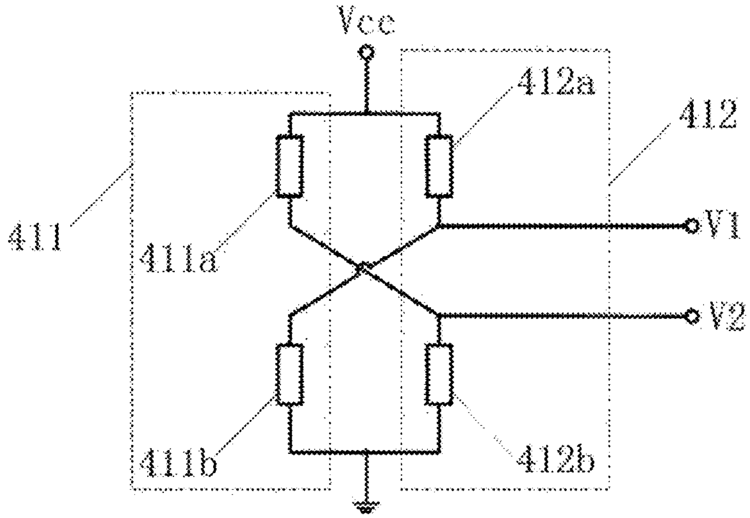
FIG. 6 is a schematic diagram of a differential full-bridge structure.

FIG. 6 shows a schematic diagram of a differential full-bridge structure. As shown in FIG. 6, the low current detection module 4 uses a single bridge with a differential full-bridge structure. Specifically, the third magnetic sensing unit 411 and the fourth magnetic sensing unit 412 in the second magnetic induction module are connected to form a differential full-bridge structure. For the differential full-bridge structure, the third magnetic sensing unit 411 includes two magnetoresistive bridge arms 411*a* and 411*b*, and the fourth magnetic sensing unit 412 includes two magnetoresistive bridge arms 412*a* and 412*b*. The sensitivity directions of the four magnetoresistive bridge arms 411*a*, 411*b*, 412*a*, and 412*b* in the second magnetic induction module are completely the same and are horizontally rightward, and are electrically connected to form the same differential full-bridge structure. Optionally, the magnetoresistive bridge arm is composed of one or more magnetoresistive sensitive components, and the magnetoresistive sensitive component in each magnetoresistive bridge arm is a TMR device.

As shown in FIG. 1 and FIG. 6, the rightward magnetic field at the third magnetic sensing unit 411 is greater than the rightward magnetic field at the fourth magnetic sensing unit 412. Since the sensitivity directions of the four magnetoresistive bridge arms 411*a*, 411*b*, 412*a*, and 412*b* are all rightward, the rightward magnetic field at the magnetoresistive bridge arms 411*a* and 411*b* is greater than the rightward magnetic field at the magnetoresistive bridge arms 412*a* and 412*b*, and then the resistance of the magnetoresistive bridge arms 411*a* and 411*b* is less than the resistance of the magnetoresistive bridge arms 412*a* and 412*b*. Based on this, it can be concluded that in FIG. 6, a voltage V2 is greater than a voltage V1, thereby forming a differential voltage signal.

Figure 7:
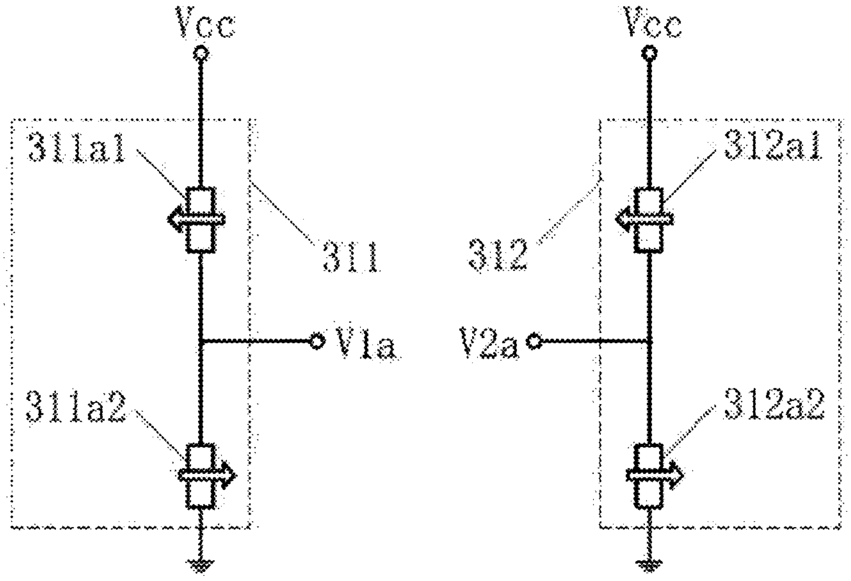
FIG. 7 is a schematic diagram of a double push-pull half-bridge differential structure.

FIG. 7 shows a schematic diagram of a double push-pull half-bridge differential structure. As shown in FIG. 4 and FIG. 7, the high current detection module 3 uses a double push-pull half-bridge differential structure for differentiation. Specifically, the first magnetic sensing unit 311 and the second magnetic sensing unit 312 in the first magnetic induction module are connected to form the double push-pull half-bridge differential structure. The first magnetic sensing unit 311 includes two magnetoresistive bridge arms 311*a*1 and 311*a*2, and the two bridge arms form a first push-pull half-bridge structure, where the sensitivity direction of the magnetoresistive bridge arm 311*a*1 is leftward, and the sensitivity direction of the magnetoresistive bridge arm 311*a*2 is rightward. The second magnetic sensing unit 312 includes two magnetoresistive bridge arms 312*a*1 and 312*a*2, and the two bridge arms form a second push-pull half-bridge structure, where the sensitivity direction of the magnetoresistive bridge arm 312*a*1 is leftward, and the sensitivity direction of the magnetoresistive bridge arm 312*a*2 is rightward. Optionally, the magnetoresistive bridge arm is composed of one or more magnetoresistive sensitive components, and the magnetoresistive sensitive component is a GMR device.

With reference to FIG. 1 and FIG. 7, assuming that the direction is rightward after the common mode magnetic field is offset, and the rightward magnetic field at the first magnetic sensing unit 311 is greater than the rightward magnetic field at the second magnetic sensing unit 312 after the differential mode magnetic field is superimposed, the resistance of the magnetoresistive bridge arm 311*a*1 is greater than the resistance of the magnetoresistive bridge arm 311*a*2, the resistance of the magnetoresistive bridge arm 312*a*1 is greater than the resistance of the magnetoresistive bridge arm 312*a*2, and the resistance difference between the magnetoresistive bridge arms 311*a*1 and 311*a*2 is greater than the resistance difference between the magnetoresistive bridge arms 312*a*1 and 312*a*2, thereby realizing the change from a magnetic field to a voltage. Based on this, V1*a* and V2*a* in FIG. 7 will change correspondingly according to the situation of the current to be measured to form a differential voltage signal.

Figure 8:
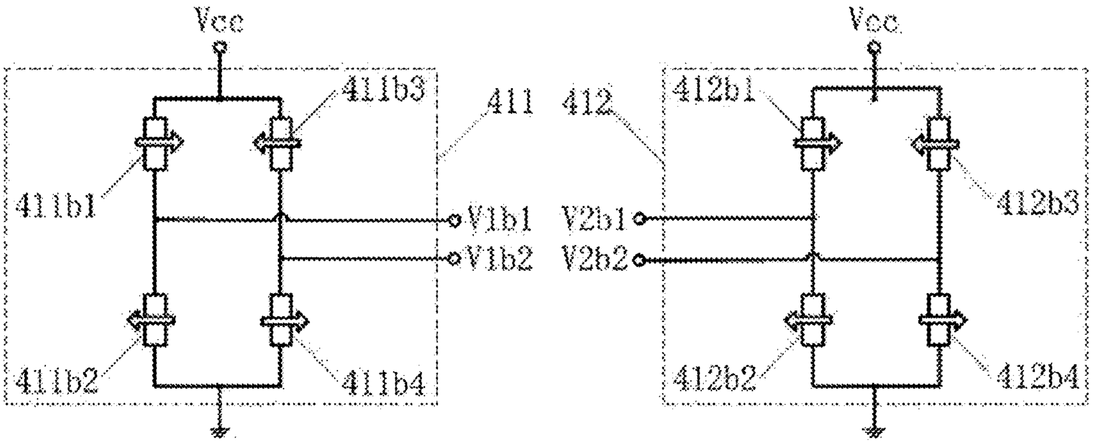
FIG. 8 is a schematic diagram of a double push-pull full-bridge differential structure.

FIG. 8 shows a schematic diagram of a double push-pull full-bridge differential structure. With reference to FIG. 4 and FIG. 8, the low current detection module 4 uses a double push-pull full-bridge differential structure for differentiation. Specifically, the third magnetic sensing unit 411 includes four magnetoresistive bridge arms 411*b*1, 411*b*2, 411*b*3, and 411*b*4 therein, forming a push-pull full-bridge structure, where the sensitivity directions of the magnetoresistive bridge arms 411*b*2 and 411*b*3 are both leftward, and the sensitivity directions of the magnetoresistive bridge arms 411*b*1 and 411*b*4 are both rightward. The fourth magnetic sensing unit 412 includes four magnetoresistive bridge arms 412*b*1, 412*b*2, 412*b*3, and 412*b*4 therein, forming another push-pull full-bridge structure, where the sensitivity directions of the magnetoresistive bridge arms 412*b*2 and 412*b*3 are both leftward, and the sensitivity directions of the magnetoresistive bridge arms 412*b*1 and 412*b*4 are both rightward. The magnetoresistive sensitive component forming the magnetoresistive bridge arm is a GMR device.

With reference to FIG. 4 and FIG. 8, the third magnetic sensing unit 411 is mainly affected by the magnetic field in the rightward direction generated by the current shunting copper bar 22, and the fourth magnetic sensing unit 412 is mainly affected by the magnetic field in the leftward direction generated by the current shunting copper bar 21. In FIG. 8, the voltage difference between V1*b*1 and V1*b*2 forms an output signal of the third magnetic sensing unit 411, and the voltage difference between V2*b*1 and V2*b*2 forms an output signal of the fourth magnetic sensing unit 412. According to the characteristics of the double push-pull full-bridge differential structure, it can be concluded that the differential voltage signals of the two push-pull full-bridge structures mentioned above change linearly with the current to be measured.

Optionally, the first signal output module and the second signal output module respectively include an open-loop signal conditioning circuit using an open-loop circuit or a closed-loop signal conditioning circuit using a closed-loop circuit and a feedback coil.

For the open-loop circuit, the first signal output module or the second signal output module uses the open-loop signal conditioning circuit, and the signal output module uses the open-loop signal conditioning circuit to perform conditioning amplification, temperature compensation, and linearity correction on the differential signal of two magnetic sensing units in the module. The open-loop signal conditioning circuit is one of a printed circuit board (PCB)-level discrete component circuit or an application specific integrated circuit (ASIC).

For the closed-loop circuit, the first signal output module or the second signal output module uses the closed-loop signal conditioning circuit and the feedback coil, and the signal output module uses the closed-loop signal conditioning circuit and the feedback coil to perform conditioning amplification, temperature compensation, and linearity correction on the differential signal of two magnetic sensing units in the module. The closed-loop signal conditioning circuit, the feedback coil, and the magnetic sensing unit in the high current detection module or the low current detection module form a closed-loop magnetic field feedback, the differential signal of two magnetic sensing units in the module is amplified, and then, a feedback magnetic field is generated through the feedback coil to reversely offset the differential mode magnetic field. When the dynamic balance of the magnetic field is reached, two magnetic sensing units in the module operate at equal common mode magnetic field operating points, and the feedback current of the feedback coil is sampled through a sampling resistor to form an output signal of the magnetic induction module.

The closed-loop signal conditioning circuit is one of a PCB-level discrete component circuit or an ASIC. The feedback coil is integrated in the closed-loop signal conditioning circuit, the circuit board, the magnetic sensing unit, the ASIC, or the magnetic induction module.

In this embodiment, the first signal output module and the second signal output module respectively include an open-loop signal conditioning circuit using an open-loop circuit or a closed-loop signal conditioning circuit using a closed-loop circuit and a feedback coil. That is to say, in a specific embodiment of the present invention, the first signal output module and the second signal output module may both include an open-loop signal conditioning circuit using an open-loop circuit; or the first signal output module and the second signal output module may both include a closed-loop signal conditioning circuit using a closed-loop circuit and a feedback coil; or the first signal output module includes an open-loop signal conditioning circuit using an open-loop circuit, and the second signal output module includes a closed-loop signal conditioning circuit using a closed-loop circuit and a feedback coil; or the first signal output module may both include a closed-loop signal conditioning circuit using a closed-loop circuit and a feedback coil, and the second signal output module includes an open-loop signal conditioning circuit using an open-loop circuit.

The first signal output module using a closed-loop circuit in the high current detection module is taken as an example. The first signal output module includes a closed-loop signal conditioning circuit and a feedback coil. The closed-loop signal conditioning circuit, the feedback coil, and the magnetic sensing unit in the module form a closed-loop magnetic field feedback. The magnetic field feedback coil may be integrated in a closed-loop signal conditioning circuit, or may be integrated in a circuit board, or may be integrated in a magnetic sensing unit, or may use an ASIC, or may be integrated in a magnetic induction module. Regardless of where the magnetic field feedback coil is integrated, the magnetic field closed-loop negative feedback principle thereof is roughly the same.

In the first signal output module, a closed-loop signal conditioning circuit and a feedback coil are used to perform conditioning amplification, temperature compensation, and linearity correction on the differential voltage signal. The closed-loop signal conditioning circuit amplifies the differential voltage signal, and then drives the feedback coil to generate a feedback magnetic field to reversely offset the differential mode magnetic field. When the dynamic balance of the magnetic field is reached, the first magnetic sensing unit and the second magnetic sensing unit operate at equal common mode magnetic field operating points, and the feedback current of the feedback coil is sampled through the sampling resistor to form an output of the first magnetic induction module. Optionally, the closed-loop signal conditioning circuit uses a PCB-level discrete component circuit.

As shown in FIG. 1, the first signal output module 32 in the high current detection module 3 includes a magnetic field feedback coil, and the magnetic field feedback coil is integrated in the first magnetic induction module. Here, the reference numeral 32 may be equivalent to the magnetic field feedback coil in the first signal output module. The plane where the magnetic field feedback coil 32 is located is parallel to the plane where the first magnetic sensing unit 311 and the second magnetic sensing unit 312 are located. The cross section of the magnetic field feedback coil 32 is symmetrically distributed along both sides of a midline. The current direction on one side of the midline is perpendicular to the paper and outward, and the current direction on the other side of the midline is perpendicular to the paper and inward.

Regarding the direction of the feedback magnetic field generated by the magnetic field feedback coil 32, taking the case where the rightward magnetic field at the first magnetic sensing unit 311 is greater than the rightward magnetic field at the second magnetic sensing unit 312 as an example, in order to reversely offset the differential mode magnetic field, in the cross-sectional view shown in FIG. 1, optionally, the current direction of the cross section of the conductor arranged horizontally on the left side of the midline of the magnetic field feedback coil 32, that is, below the first magnetic sensing unit 311, is perpendicular to the paper and outward, and the current direction of the cross section of the conductor arranged horizontally on the right side of the midline of the magnetic field feedback coil 32, that is, below the second magnetic sensing unit 312, is perpendicular to the paper and inward. As a result, a leftward feedback magnetic field is generated at the first magnetic sensing unit 311, and a rightward feedback magnetic field is generated at the second magnetic sensing unit 312, thereby reversely offsetting the differential mode magnetic field and finally achieving the dynamic balance of the magnetic field.

As shown in FIG. 4, the magnetic field feedback coil 32 is integrated in the magnetic sensing unit in the module, and the magnetic field feedback coil 42 is integrated in the magnetic sensing unit in the module. The position of the feedback coil is not limited to the position shown in the figure above. Although the distribution or connection of the magnetic field feedback coil is slightly different, the magnetic field feedback principle is the same, and both use the distribution of the magnetic field feedback coil to generate a magnetic field in an opposite direction to offset the differential mode magnetic field.

Similarly, the low current detection module 4 includes a second signal output module, and the second signal output module uses a closed-loop signal conditioning circuit and a feedback coil 42. The circuit structure and magnetic field feedback principle thereof are roughly the same as those of the high current detection module 3 and are not described in detail. Optionally, the feedback coil 42 is integrated in the second magnetic induction module, but the position of the feedback coil is not limited thereto.

In this embodiment, the current sensor can achieve high-accuracy detection when either a high current or a low current is inputted, can effectively solve the problem that magnetoresistive sensitive components are easily saturated, is suitable for magnetic sensing units in various linear working ranges, provides a good ability to resist external magnetic field interference, and has the characteristics of being able to measure high direct currents and alternating currents and input and output electrical isolation. Combined with the characteristics of TMR devices, such as small size, large signal amplitude, high sensitivity, low noise, and easy integration with semiconductor circuits, the design of a back-end signal processing circuit of the current sensor can be further simplified, the size of the entire current sensor can be reduced, and the cost of the current sensor can be reduced.

Optionally, the third magnetic sensing unit and the fourth magnetic sensing unit in the second magnetic induction module are placed in any one of the following two ways: (1) the third magnetic sensing unit is located above the input module, the fourth magnetic sensing unit is located below or on a side of the input module, and the sensitivity directions of the third magnetic sensing unit and the fourth magnetic sensing unit are the same; (2) the third magnetic sensing unit and the fourth magnetic sensing unit are located on the same side of the input module; the third magnetic sensing unit is located within the vertical projection coverage of the current shunting copper bar or differential copper bar closest to the third magnetic sensing unit, and the sensitivity direction of the third magnetic sensing unit is the same as or opposite to the direction of the magnetic field generated at the position of the third magnetic sensing unit by the current shunting copper bar or differential copper bar closest to the third magnetic sensing unit, and is along the direction in the plane of the second magnetic induction module and perpendicular to the direction of the current to be measured; and the fourth magnetic sensing unit is located outside the vertical projection coverage of the current shunting copper bar and the differential copper bar, and the sensitivity direction of the fourth magnetic sensing unit is the same as that of the third magnetic sensing unit.

As shown in FIG. 1, the third magnetic sensing unit 411 and the fourth magnetic sensing unit 412 are located on the same side of the input module, and optionally are close to the current shunting copper bar 2 and away from the differential copper bar 1. The third magnetic sensing unit 411 is located within the vertical projection coverage of the current shunting copper bar 2, the sensitivity direction of the third magnetic sensing unit 411 is the same as or opposite to the direction of the magnetic field generated by the current shunting copper bar 2 at the position of the third magnetic sensing unit 411, and the sensitivity direction is along the direction in the plane of the second magnetic induction module and perpendicular to the direction of the current to be measured. The fourth magnetic sensing unit 412 is located outside the vertical projection coverage of the current shunting copper bar 2, and the sensitivity direction of the fourth magnetic sensing unit 412 is the same as that of the third magnetic sensing unit 411.

As shown in FIG. 4, the third magnetic sensing unit 411 and the fourth magnetic sensing unit 412 are located on different sides of the input module. Optionally, the third magnetic sensing unit 411 is located above the input module, and the fourth magnetic sensing unit 412 is located below or on a side of the input module. The sensitivity directions of the third magnetic sensing unit 411 and the fourth magnetic sensing unit 412 are the same and are both rightward. Specifically, the third magnetic sensing unit 411 is located in a magnetic field uniform area above the outside of the input module, and the fourth magnetic sensing unit 412 is located in a magnetic field uniform area below the outside of the input module. The magnetic fields generated by the differential copper bar 1 and the current shunting copper bars 21 and 22 at the positions of the third magnetic sensing unit 411 and the fourth magnetic sensing unit 412 of the low current detection module 4 are superimposed to increase, thereby generating a larger magnetic field in the case of a low current to ensure more accurate detection of a low current to be measured.

Optionally, the current sensor further includes: a third current detection module, the third current detection module including a third magnetic induction module and a third signal output module. The third magnetic induction module is composed of the first magnetic sensing unit or the second magnetic sensing unit in the first magnetic induction module and the third magnetic sensing unit or the fourth magnetic sensing unit in the second magnetic induction module, and two magnetic sensing units in the third magnetic induction module differentially sense the magnetic field of the input module, and form an output signal of the current sensor through the third signal output module.

As shown in FIG. 4, optionally, the current sensor further includes a third current detection module 8, the third current detection module 8 including a third magnetic induction module and a third signal output module. The third magnetic induction module includes two magnetic sensing units, where the second magnetic sensing unit 312 in the first magnetic induction module is multiplexed as one magnetic sensing unit in the third magnetic induction module, and the third magnetic sensing unit 411 in the second magnetic induction module is multiplexed as another magnetic sensing unit in the third magnetic induction module. Optionally, the second magnetic sensing unit 312 has a push-pull half-bridge structure, and the third magnetic sensing unit 411 has a push-pull full-bridge structure. The second magnetic sensing unit 312 and the third magnetic sensing unit 411 differentially sense the magnetic field of the input module, and form an output signal of the current sensor through the third signal output module.

In this embodiment, a differential copper bar 1 with a rectangular cross section and two current shunting copper bars 21 and 22 with rectangular cross sections are connected in parallel to shunt the current to be measured. The current input range and the sensitivity of the current sensor can be regulated by adjusting the shape and distribution of each copper bar. The high current detection module 3 uses a double half-bridge structure with two push-pull half-bridges for differentiation, and the low current detection module 4 uses a double full-bridge structure with a push-pull full-bridge for differentiation. Moreover, the third magnetic sensing unit 411 is located in the magnetic field uniform area above the outside of the input module, and the fourth magnetic sensing unit 412 is located in the magnetic field uniform area below the outside of the input module. Optionally, a closed-loop signal conditioning circuit using an ASIC is used, the feedback coil is integrated in the magnetic sensing unit, and the magnetoresistive sensitive component uses a giant magnetoresistance (GMR) device.

In addition, a third magnetic induction module is added, and the push-pull half-bridge output of the second magnetic sensing unit 312 and the push-pull full-bridge output of the third magnetic sensing unit 411 are selected for differentiation, thereby providing three output options. Thus, the current sensor can achieve high-accuracy detection when either a high current or a low current is inputted, can effectively solve the problem that magnetoresistive sensitive components are easily saturated, is suitable for magnetic sensing units in various linear working ranges, provides a good ability to resist external magnetic field interference, and has the characteristics of being able to measure high direct currents and alternating currents and input and output electrical isolation. Combined with the characteristics of GMR devices, such as small size, large signal amplitude, high sensitivity, low noise, and easy integration with semiconductor circuits, the design of a back-end signal processing circuit of the current sensor can be further simplified, the size of the entire current sensor can be reduced, and the cost of the current sensor can be reduced.

Figure 9:
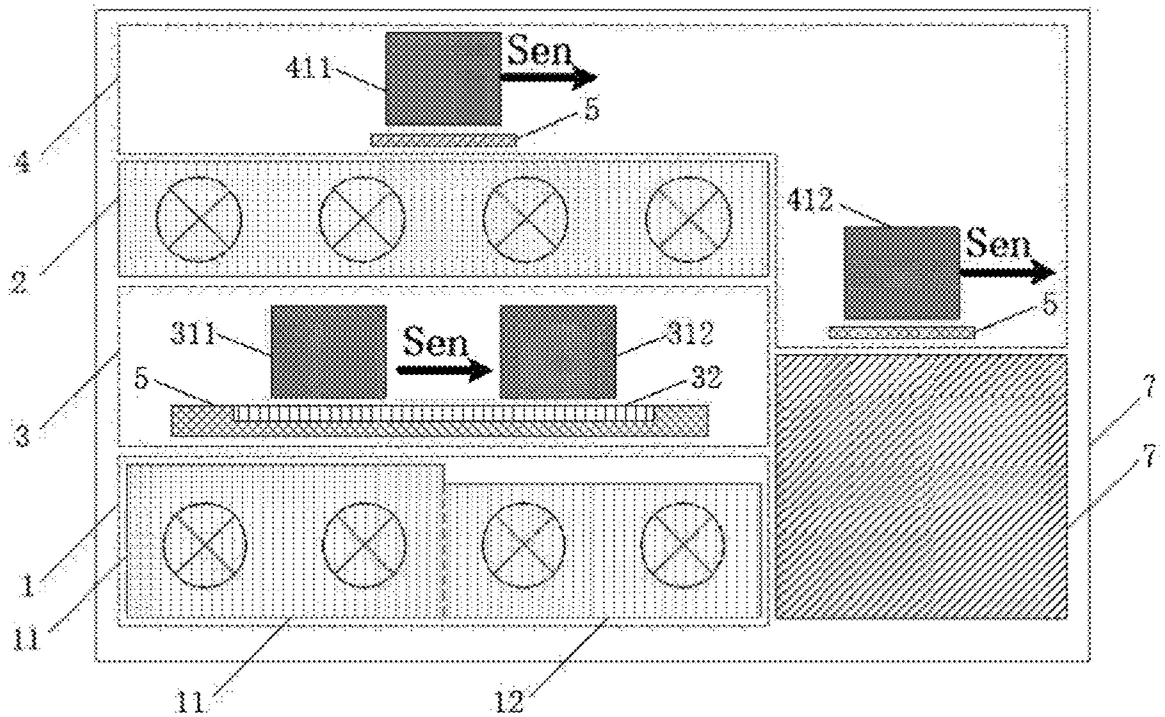
FIG. 9 is a schematic diagram of still another current sensor provided in an embodiment of the present invention.

FIG. 9 shows a schematic diagram of still another current sensor provided in an embodiment of the present invention. As shown in FIG. 9, the current sensor includes an input module, a high current detection module 3, a low current detection module 4, a circuit board 5, and a mechanical support housing 7. The input module is composed of a differential copper bar 1 with a rectangular cross section and two current shunting copper bars 21 and 22 with rectangular cross sections, which are connected in parallel and shunted, and the principle of generating a magnetic field is roughly the same as that in FIG. 1.

The structure and principle of the high current detection module 3 are roughly the same as those in FIG. 1. The first magnetic sensing unit 311 and the second magnetic sensing unit 312 in the first magnetic induction module electrically form a differential half-bridge structure shown in FIG. 5, and then differentiation is performed to form a differential voltage signal. The first signal output module is composed of a closed-loop signal conditioning circuit and a feedback coil 32. Optionally, the feedback coil 32 is integrated in the circuit board 5. The magnetoresistive unit is composed of magnetoresistive sensitive components connected in series and parallel. Optionally, the magnetoresistive sensitive component uses a CMR device.

The third magnetic sensing unit 411 and the fourth magnetic sensing unit 412 in the second magnetic induction module in the low current detection module 4 use two push-pull full-bridge structures shown in FIG. 8 to perform differentiation and form differential voltage signals to be outputted. Optionally, the fourth magnetic sensing unit 412 is located on a side of the outside of the input module, and the sensitivity directions of the third magnetic sensing unit 411 and the fourth magnetic sensing unit 412 are both rightward. In addition, in this embodiment, the second signal output module uses an open-loop signal conditioning circuit to perform conditioning amplification, temperature compensation, and linearity correction on the differential voltage signal of the third magnetic sensing unit 411 and the fourth magnetic sensing unit 412. The open-loop signal conditioning circuit uses a PCB-level discrete component circuit, and the magnetoresistive sensitive component uses a CMR device.

In this embodiment, the current sensor can achieve high-accuracy detection when either a high current or a low current is inputted, can effectively solve the problem that magnetoresistive sensitive components are easily saturated, is suitable for magnetic sensing units in various working ranges, provides a good ability to resist external magnetic field interference, is relatively small in size, and has the characteristics of being able to measure high direct currents and alternating currents and input and output electrical isolation.

An embodiment of the present invention further provides a current sensor which is different from that in the above embodiment, where a differential copper bar may not be provided. The current sensor includes: an input module, a high current detection module, a low current detection module, and a circuit board. The input module includes two or more current shunting copper bars connected in parallel. A current to be measured flows perpendicularly to a cross section of the current shunting copper bars, and generates a magnetic field at the positions of the high current detection module and the low current detection module. The high current detection module is located in an internal gap of the input module. The high current detection module includes a first magnetic induction module and a first signal output module which are secured on the circuit board, and the first magnetic induction module includes a first magnetic sensing unit. The first magnetic sensing unit senses the magnetic field of the input module, and forms an output signal of the current sensor through the first signal output module. The low current detection module is located outside the input module. The low current detection module includes a second magnetic induction module and a second signal output module which are secured on the circuit board, and the second magnetic induction module includes a second magnetic sensing unit. The second magnetic sensing unit senses the magnetic field of the input module, and forms an output signal of the current sensor through the second signal output module.

Figure 10:
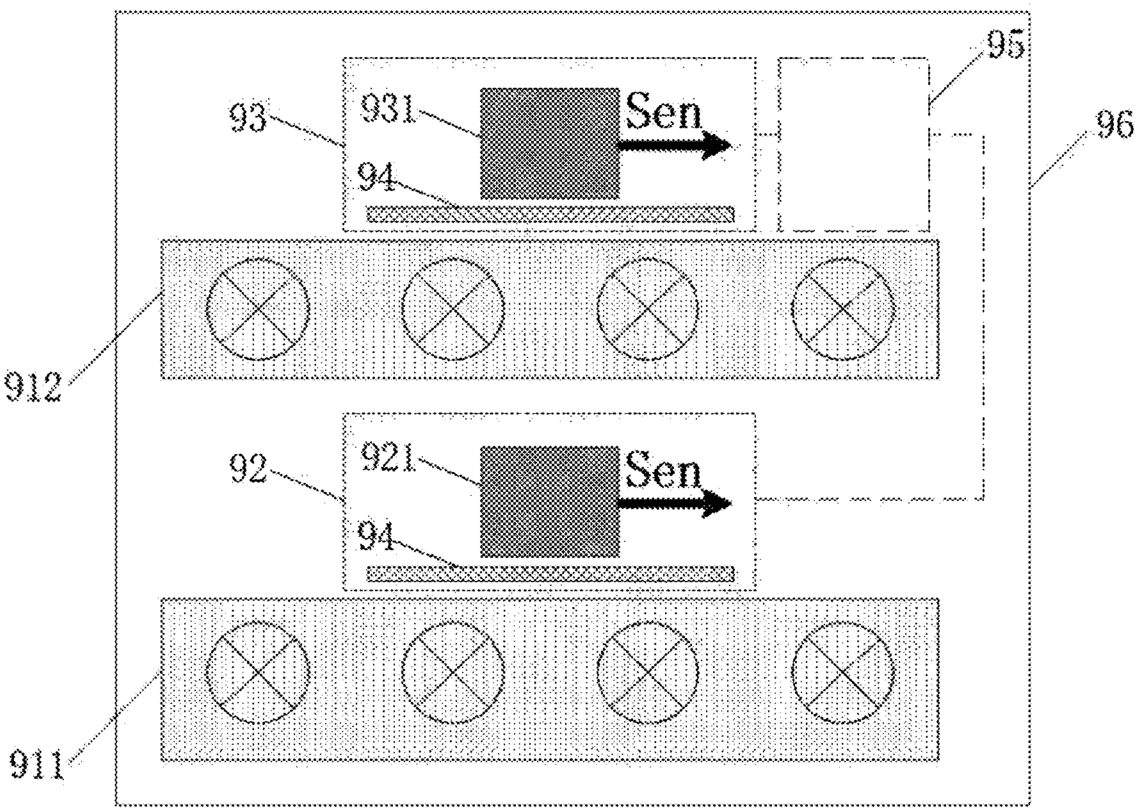
FIG. 10 is a schematic diagram of yet another current sensor provided in an embodiment of the present invention.

FIG. 10 shows a schematic diagram of yet another current sensor provided in an embodiment of the present invention. As shown in FIG. 10, the current sensor includes an input module, a high current detection module 92, a low current detection module 93, a circuit board 94, and a mechanical support housing 96.

In this embodiment, the input module is composed of two current shunting copper bars 911 and 912 with rectangular cross sections, which are connected in parallel and shunted. The current to be measured flows perpendicularly to the cross section of the current shunting copper bar 911 and the current shunting copper bar 912, and the current to be measured is perpendicular to the paper and inward, and generates a magnetic field at the positions of the high current detection module 92 and the low current detection module 93.

The high current detection module 92 is located in a gap between the current shunting copper bar 911 and the current shunting copper bar 912, and includes a first magnetic induction module and a first signal output module which are secured on the circuit board 94. The first magnetic induction module includes a magnetic sensing unit 921. The magnetic sensing unit 921 senses the magnetic field generated by the current in the input module, and forms an output signal of the current sensor through the first signal output module. For the high current detection module 92, the magnetic field generated by the current shunting copper bar 911 at the magnetic sensing unit 921 is rightward, the magnetic field generated by the current shunting copper bar 912 at the magnetic sensing unit 921 is leftward, and the two are mutually offset or reduced. By adjusting the shape of the current shunting copper bar, the size of the magnetic field can be adjusted, thereby achieving high current detection.

The low current detection module 93 is located above the current shunting copper bar 912, and includes a second magnetic induction module and a second signal output module which are secured on the circuit board 94. The second magnetic induction module includes a magnetic sensing unit 931. The magnetic sensing unit 931 senses the magnetic field generated by the current in the input module, and forms an output signal of the current sensor through the second signal output module. The magnetic sensing unit 921 and the magnetic sensing unit 931 both use a GMI device with a rightward sensitivity direction. For the low current detection module 93, the magnetic sensing unit 931 is mainly affected by the rightward magnetic field generated by the current shunting copper bar 912. The magnetic fields generated by the current shunting copper bars 911 and 912 have the same direction and are superimposed to increase to generate a larger magnetic field in the case of a low current, thus achieving relatively high accuracy in low current detection.

As shown in FIG. 10, optionally, the current sensor further includes a differential detection module 95. The differential detection module 95 uses the first magnetic sensing unit 921 in the high current detection module 92 and the second magnetic sensing unit 931 in the low current detection module 93 to differentially sense the magnetic field of the input module, and form an output signal of the current sensor through a third signal output module. Since there is a difference between the magnetic fields at the positions of the magnetic sensing unit 921 and the magnetic sensing unit 931, the output voltages of two GMI devices can be differentiated, and an output signal of the current sensor can be formed through the third signal output module.

In this embodiment, the magnetic induction module senses the differential mode magnetic field generated by the current to be measured flowing through the input module in a non-differential manner. The high current detection module is located in the gap between the current shunting copper bar 911 and the current shunting copper bar 912, and measures the magnetic field after the current shunting copper bars 911 and 912 are offset. The high current measurement is achieved by mutual offsetting of multiple current shunting copper bars. The low current detection module 93 is located above the current shunting copper bar 912, and measures the magnetic field that is increased after the current shunting copper bars 911 and 912 are superimposed. The high current detection module 3 and the low current detection module 4 respectively use a separate GMI device to measure an output signal in a non-differential form, and the differential detection module 95 differentiates the voltages outputted by the two GMI devices, thereby providing three output options. The current sensor can measure high direct currents and alternating currents, realizes input and output electrical isolation, is suitable for magnetic sensing units in various linear working ranges, and has a simple structure, thereby further reducing the size and reducing the cost. In addition, closed-loop negative feedback can be used to provide high-accuracy current measurement with high linearity, strong ability to resist common mode interference, good temperature characteristics, and stable and reliable performance.

It should be noted that the above descriptions are merely preferred embodiments and used technical principles of the present invention. Those skilled in the art should understand that the present invention is not limited to the specific embodiments herein, and for those skilled in the art, various obvious variations, readjustments, mutual combinations, and replacements may be made without departing from the protection scope of the present invention. Therefore, although the present invention has been described in detail with the above embodiments, the present invention is not limited to the above embodiments. Without departing from the concept of the present invention, more other equivalent embodiments may also be included, and the scope of the present invention is defined by the scope of the appended claims.

The invention claimed is:

1. A current sensor, comprising: an input module, a high current detection module, a low current detection module, a switching module, and a circuit board, wherein the input module comprises a differential copper bar and a current shunting copper bar connected in parallel, and a current to be measured flows perpendicularly to a cross section of the differential copper bar and the current shunting copper bar, and generates a magnetic field at the positions of the high current detection module and the low current detection module;

the high current detection module comprises a first magnetic induction module and a first signal output module, the first magnetic induction module is secured on the circuit board and placed in an internal gap of the input module, the first magnetic induction module at least comprises a first magnetic sensing unit and a second magnetic sensing unit therein, and the first magnetic sensing unit and the second magnetic sensing unit differentially sense the magnetic field of the input module, and form an output signal through the first signal output module; and the low current detection module comprises a second magnetic induction module and a second signal output module, the second magnetic induction module is secured on the circuit board and placed outside the input module, the second magnetic induction module at least comprises a third magnetic sensing unit and a fourth magnetic sensing unit therein, and the third magnetic sensing unit and the fourth magnetic sensing unit differentially sense the magnetic field of the input module, and form an output signal through the second signal output module;

wherein the switching module selects to switch to the high current detection module or the low current detection module according to a range of the current to be measured; and the input module, the high current detection module, the low current detection module, and the switching module are electrically isolated from each other.

2. The current sensor according to claim 1, wherein the first magnetic sensing unit is located above the differential copper bar, and a sensitivity direction of the first magnetic sensing unit is the same as or opposite to a direction of the magnetic field generated by the differential copper bar at the first magnetic sensing unit, and is along a direction in a plane of the first magnetic induction module and perpendicular to a direction of the current to be measured; and a sensitivity direction of the second magnetic sensing unit is the same as that of the first magnetic sensing unit, and a distance between the second magnetic sensing unit and the differential copper bar is greater than a distance between the first magnetic sensing unit and the differential copper bar.

3. The current sensor according to claim 1, wherein the differential copper bar is in a step shape near the first magnetic induction module, and at least comprises a first step and a second step;

the-first magnetic sensing unit is located above the first step, and the second magnetic sensing unit is located above the second step;

a sensitivity direction of the first magnetic sensing unit is the same as or opposite to a direction of a magnetic field generated by the differential copper bar at the first magnetic sensing unit, and is along a direction in a plane of the first magnetic induction module and perpendicular to a direction of the current to be measured; and a sensitivity direction of the second magnetic sensing unit is the same as or opposite to a direction of the magnetic field generated by the differential copper bar at the second magnetic sensing unit, and is along a direction in a plane of the second magnetic induction module and perpendicular to a direction of the current to be measured.

4. The current sensor according to claim 1, wherein the first magnetic sensing unit and the second magnetic sensing unit in the first magnetic induction module are connected to form any one of a differential half-bridge structure, a differential full-bridge structure, a double push-pull half-bridge differential structure, and a double push-pull full-bridge differential structure;

the third magnetic sensing unit and the fourth magnetic sensing unit in the second magnetic induction module are connected to form any one of a differential half-bridge structure, a differential full-bridge structure, a double push-pull half-bridge differential structure, and a double push-pull full-bridge differential structure;

for the differential half-bridge structure, each magnetic sensing unit comprises a magnetoresistive bridge arm, and two magnetoresistive bridge arms in the same magnetic induction module are electrically differentiated together to form the differential half-bridge structure;

for the differential full-bridge structure, each magnetic sensing unit comprises two magnetoresistive bridge arms, two magnetoresistive bridge arms in the same magnetic sensing unit are located on two opposite bridge arms, two magnetoresistive bridge arms of different magnetic sensing units are located on two adjacent bridge arms to form the differential full-bridge structure, and an output signal of the magnetic induction module is a differential signal of the differential full-bridge structure;

for the double push-pull half-bridge differential structure, two magnetic sensing units in the same magnetic induction module both comprise two magnetoresistive bridge arms, two magnetoresistive bridge arms in each magnetic sensing unit have opposite sensitivity directions, two magnetoresistive bridge arms in the magnetic sensing unit are upper and lower bridge arms and form a push-pull half-bridge structure, sensitivity directions of the upper bridge arms in the two magnetic sensing units are the same and sensitivity directions of the lower bridge arms in the two magnetic sensing units are the same, two magnetic sensing units in the same magnetic induction module form the double push-pull half-bridge differential structure as a whole, and an output signal of the magnetic induction module is a differential signal of the double push-pull half-bridge differential structure;

for the double push-pull full-bridge differential structure, two magnetic sensing units in the same magnetic induction module both comprise four magnetoresistive bridge arms, four magnetoresistive bridge arms of the magnetic sensing unit form a push-pull full-bridge structure, sensitivity directions of two magnetic sensing units in the same magnetic induction module are the same, two magnetic sensing units in the same magnetic induction module form the double push-pull full-bridge differential structure as a whole, and an output signal of the magnetic induction module is a differential signal of the double push-pull full-bridge differential structure; and the magnetoresistive bridge arm is formed by connecting one or more magnetoresistive sensitive components in series and parallel.

5. The current sensor according to claim 1, wherein the first signal output module and the second signal output module respectively comprise an open-loop signal conditioning circuit using an open-loop circuit or a closed-loop signal conditioning circuit using a closed-loop circuit and a feedback coil;

for the open-loop circuit, the first signal output module or the second signal output module uses the open-loop signal conditioning circuit to perform conditioning amplification, temperature compensation, and linearity correction on a differential signal of two magnetic sensing units in the module; the open-loop signal conditioning circuit is one of a printed circuit board (PCB)-level discrete component circuit or an application specific integrated circuit (ASIC);

for the closed-loop circuit, the first signal output module or the second signal output module uses the closed-loop signal conditioning circuit and the feedback coil to perform conditioning amplification, temperature compensation, and linearity correction on a differential signal of two magnetic sensing units in the module; the closed-loop signal conditioning circuit, the feedback coil, and a magnetic sensing unit in the high current detection module or the low current detection module form a closed-loop magnetic field feedback, a differential signal of two magnetic sensing units in the module is amplified, and then a feedback magnetic field is generated through the feedback coil to reversely offset a differential mode magnetic field; when dynamic balance of the magnetic field is reached, two magnetic sensing units in the module operate at equal common mode magnetic field operating points, and a feedback current of the feedback coil is sampled through a sampling resistor to form an output signal of the magnetic induction module;

the closed-loop signal conditioning circuit is one of a PCB-level discrete component circuit or an ASIC; and the feedback coil is integrated in the closed-loop signal conditioning circuit, the circuit board, the magnetic sensing unit, the ASIC, or the magnetic induction module.

6. The current sensor according to claim 1, wherein the third magnetic sensing unit and the fourth magnetic sensing unit in the second magnetic induction module are placed in any one of the following two ways:

(1) the third magnetic sensing unit is located above the input module, the fourth magnetic sensing unit is located below or on a side of the input module, and sensitivity directions of the third magnetic sensing unit and the fourth magnetic sensing unit are the same;

(2) the third magnetic sensing unit and the fourth magnetic sensing unit are located on a same side of the input module; the third magnetic sensing unit is located within a vertical projection coverage of the current shunting copper bar or differential copper bar closest to the third magnetic sensing unit, and a sensitivity direction of the third magnetic sensing unit is the same as or opposite to a direction of a magnetic field generated at a position of the third magnetic sensing unit by the current shunting copper bar or differential copper bar closest to the third magnetic sensing unit, and is along a direction in a plane of the second magnetic induction module and perpendicular to a direction of the current to be measured; and the fourth magnetic sensing unit is located outside the vertical projection coverage of the current shunting copper bar and the differential copper bar, and a sensitivity direction of the fourth magnetic sensing unit is the same as that of the third magnetic sensing unit.

7. The current sensor according to claim 1, further comprising: a third current detection module, the third current detection module comprising a third magnetic induction module and a third signal output module; and the third magnetic induction module is composed of the first magnetic sensing unit or the second magnetic sensing unit in the first magnetic induction module and the third magnetic sensing unit or the fourth magnetic sensing unit in the second magnetic induction module, and two magnetic sensing units in the third magnetic induction module differentially sense the magnetic field of the input module, and form an output signal of the current sensor through the third signal output module.

8. The current sensor according to claim 1, wherein a number of current shunting copper bars is one or more, any current shunting copper bar is located above the first magnetic induction module or below the differential copper bar, and a vertical projection range of any current shunting copper bar covers the first magnetic sensing unit and the second magnetic sensing unit in the first magnetic induction module.

9. A current sensor, comprising: an input module, a high current detection module, a low current detection module, a third current detection module, and a circuit board, wherein the input module comprises two or more current shunting copper bars connected in parallel; a current to be measured flows perpendicularly to a cross section of the current shunting copper bars, and generates a magnetic field at the positions of the high current detection module and the low current detection module;

the high current detection module is located in an internal gap of the input module; the high current detection module comprises a first magnetic induction module and a first signal output module which are secured on the circuit board, and the first magnetic induction module comprises a first magnetic sensing unit; the first magnetic sensing unit senses the magnetic field of the input module, and forms an output signal of the current sensor through the first signal output module;

the low current detection module is located outside the input module; the low current detection module comprises a second magnetic induction module and a second signal output module which are secured on the circuit board, and the second magnetic induction module comprises a second magnetic sensing unit; and the second magnetic sensing unit senses the magnetic field of the input module, and forms an output signal of the current sensor through the second signal output module; and the third current detection module comprises a third magnetic induction module and a third signal output module; and the third magnetic induction module is composed of the first magnetic sensing unit in the first magnetic induction module and the second magnetic sensing unit in the second magnetic induction module, and the first magnetic sensing unit and the second magnetic sensing unit in the third magnetic induction module differentially sense the magnetic field of the input module, and form an output signal of the current sensor through the third signal output module.

10. The current sensor according to claim 9, further comprising a switching module, wherein the switching module selects to switch to the high current detection module, the low current detection module, or the third current detection module according to a range of the current to be measured; and the input module, the high current detection module, the low current detection module, the third current detection module, and the switching module are electrically isolated from each other.

11. The current sensor according to claim 9, wherein the first magnetic sensing unit and the second magnetic sensing unit each comprise a giant magneto-impedance device with a same sensitivity direction.

12. The current sensor according to claim 9, wherein the two or more current shunting copper bars have rectangular cross sections.

13. A current sensor, comprising: an input module, a high current detection module, a low current detection module, and a circuit board, wherein the input module comprises a differential copper bar and a current shunting copper bar connected in parallel, and a current to be measured flows perpendicularly to a cross section of the differential copper bar and the current shunting copper bar, and generates a magnetic field at positions of the high current detection module and the low current detection module;

the high current detection module comprises a first magnetic induction module and a first signal output module, the first magnetic induction module is secured on the circuit board and placed in an internal gap of the input module, the first magnetic induction module at least comprises a first magnetic sensing unit and a second magnetic sensing unit therein, and the first magnetic sensing unit and the second magnetic sensing unit differentially sense the magnetic field of the input module, and form an output signal through the first signal output module;

the low current detection module comprises a second magnetic induction module and a second signal output module, the second magnetic induction module is secured on the circuit board and placed outside the input module, the second magnetic induction module at least comprises a third magnetic sensing unit and a fourth magnetic sensing unit therein, and the third magnetic sensing unit and the fourth magnetic sensing unit differentially sense the magnetic field of the input module, and form an output signal through the second signal output module;

wherein the differential copper bar is in a step shape near the first magnetic induction module, and at least comprises a first step and a second step; the first magnetic sensing unit is located above the first step, and the second magnetic sensing unit is located above the second step; a sensitivity direction of the first magnetic sensing unit is the same as or opposite to a direction of a magnetic field generated by the differential copper bar at the first magnetic sensing unit, and is along a direction in a plane of the first magnetic induction module and perpendicular to a direction of the current to be measured; and a sensitivity direction of the second magnetic sensing unit is the same as or opposite to a direction of a magnetic field generated by the differential copper bar at the second magnetic sensing unit, and is along a direction in a plane of the second magnetic induction module and perpendicular to a direction of the current to be measured.

14. The current sensor according to claim 13, further comprising: a switching module, wherein the switching module selects to switch to the high current detection module or the low current detection module according to a range of the current to be measured; and the input module, the high current detection module, the low current detection module, and the switching module are electrically isolated from each other.

15. The current sensor according to claim 13, wherein the first signal output module and the second signal output module respectively comprise an open-loop signal conditioning circuit using an open-loop circuit or a closed-loop signal conditioning circuit using a closed-loop circuit and a feedback coil;

for the open-loop circuit, the first signal output module or the second signal output module uses the open-loop signal conditioning circuit to perform conditioning amplification, temperature compensation, and linearity correction on a differential signal of two magnetic sensing units in the module; the open-loop signal conditioning circuit is one of a printed circuit board (PCB)-level discrete component circuit or an application specific integrated circuit (ASIC);

for the closed-loop circuit, the first signal output module or the second signal output module uses the closed-loop signal conditioning circuit and the feedback coil to perform conditioning amplification, temperature compensation, and linearity correction on a differential signal of two magnetic sensing units in the module; the closed-loop signal conditioning circuit, the feedback coil, and a magnetic sensing unit in the high current detection module or the low current detection module form a closed-loop magnetic field feedback, a differential signal of two magnetic sensing units in the module is amplified, and then a feedback magnetic field is generated through the feedback coil to reversely offset a differential mode magnetic field; when dynamic balance of the magnetic field is reached, two magnetic sensing units in the module operate at equal common mode magnetic field operating points, and a feedback current of the feedback coil is sampled through a sampling resistor to form an output signal of the magnetic induction module; and the closed-loop signal conditioning circuit is one of a PCB-level discrete component circuit or an ASIC; and the feedback coil is integrated in the closed-loop signal conditioning circuit, the circuit board, the magnetic sensing unit, the ASIC, or the magnetic induction module.

16. The current sensor according to claim 13, further comprising:

a third current detection module, the third current detection module comprising a third magnetic induction module and a third signal output module; and the third magnetic induction module is composed of the first magnetic sensing unit or the second magnetic sensing unit in the first magnetic induction module and the third magnetic sensing unit or the fourth magnetic sensing unit in the second magnetic induction module, and two magnetic sensing units in the third magnetic induction module differentially sense the magnetic field of the input module, and form an output signal of the current sensor through the third signal output module.

17. The current sensor according to claim 13, wherein:

the first magnetic sensing unit and the second magnetic sensing unit in the first magnetic induction module are connected to form any one of a differential half-bridge structure, a differential full-bridge structure, a double push-pull half-bridge differential structure, and a double push-pull full-bridge differential structure; and the third magnetic sensing unit and the fourth magnetic sensing unit in the second magnetic induction module are connected to form any one of a differential half-bridge structure, a differential full-bridge structure, a double push-pull half-bridge differential structure, and a double push-pull full-bridge differential structure.

18. The current sensor according to claim 13, wherein the third magnetic sensing unit and the fourth magnetic sensing unit in the second magnetic induction module are placed in any one of the following two ways:

(1) the third magnetic sensing unit is located above the input module, the fourth magnetic sensing unit is located below or on a side of the input module, and sensitivity directions of the third magnetic sensing unit and the fourth magnetic sensing unit are the same; and (2) the third magnetic sensing unit and the fourth magnetic sensing unit are located on a same side of the input module; the third magnetic sensing unit is located within a vertical projection coverage of the current shunting copper bar or differential copper bar closest to the third magnetic sensing unit, and a sensitivity direction of the third magnetic sensing unit is the same as or opposite to a direction of a magnetic field generated at a position of the third magnetic sensing unit by the current shunting copper bar or differential copper bar closest to the third magnetic sensing unit, and is along a direction in a plane of the second magnetic induction module and perpendicular to a direction of the current to be measured; and the fourth magnetic sensing unit is located outside the vertical projection coverage of the current shunting copper bar and the differential copper bar, and a sensitivity direction of the fourth magnetic sensing unit is the same as that of the third magnetic sensing unit.

19. The current sensor according to claim 13, wherein a number of current shunting copper bars is one or more, any current shunting copper bar is located above the first magnetic induction module or below the differential copper bar, and a vertical projection range of any current shunting copper bar covers the first magnetic sensing unit and the second magnetic sensing unit in the first magnetic induction module.

* * * * *